(12) United States Patent
Banine et al.

(10) Patent No.: US 7,251,012 B2
(45) Date of Patent: Jul. 31, 2007

(54) LITHOGRAPHIC APPARATUS HAVING A DEBRIS-MITIGATION SYSTEM, A SOURCE FOR PRODUCING EUV RADIATION HAVING A DEBRIS MITIGATION SYSTEM AND A METHOD FOR MITIGATING DEBRIS

(75) Inventors: Vadim Yevgenyevich Banine, Helmond (NL); Levinus Pieter Bakker, Helmond (NL); Vladimir Vitalevitch Ivanov, Moscow (RU); Johannes Hubertus Josephina Moors, Helmond (NL); Givi Georgievitch Zukavishvili, Moscow (RU); Abraham Veefkind, Noordwijk (NL)

(73) Assignee: ASML Netherlands B.V., Veldhoven (NL)

( * ) Notice: Subject to any disclaimer, the term of this patent is extended or adjusted under 35 U.S.C. 154(b) by 83 days.

(21) Appl. No.: 10/748,851

(22) Filed: Dec. 31, 2003

(65) Prior Publication Data

US 2005/0140945 A1   Jun. 30, 2005

(51) Int. Cl.
*G03B 27/52* (2006.01)
*G03B 27/54* (2006.01)

(52) U.S. Cl. .............................. 355/30; 355/53; 355/67; 355/69; 355/77; 250/492.2; 250/504 R; 378/34; 378/119

(58) Field of Classification Search ............... 355/53, 355/67–71, 30, 77; 378/34, 119, 35; 156/345.5; 250/492.1, 492.2
See application file for complete search history.

(56) References Cited

U.S. PATENT DOCUMENTS

| 4,743,364 | A | * | 5/1988 | Kyrazis ..................... 209/212 |
| 4,837,794 | A | * | 6/1989 | Riordan et al. ............. 378/119 |
| 5,453,125 | A | * | 9/1995 | Krogh ................. 118/723 MR |
| 6,377,651 | B1 |   | 4/2002 | Richardson et al. |
| 6,657,188 | B1 | * | 12/2003 | Hulet et al. .................. 250/251 |
| 2003/0190012 | A1 |   | 10/2003 | Ahmad |
| 2005/0016679 | A1 | * | 1/2005 | Ruzic et al. ............. 156/345.5 |
| 2005/0230645 | A1 | * | 10/2005 | Melnychuk et al. ..... 250/504 R |
| 2006/0037940 | A1 | * | 2/2006 | Yan et al. ..................... 216/67 |

FOREIGN PATENT DOCUMENTS

| EP | 1 223 468 A1 | 7/2002 |
| WO | WO9919527 | * 4/1999 |
| WO | WO 03/087867 A2 | 10/2003 |

* cited by examiner

*Primary Examiner*—D. Rutledge
(74) *Attorney, Agent, or Firm*—Pillsbury Winthrop Shaw Pittman LLP

(57) ABSTRACT

A lithographic apparatus is disclosed. The apparatus includes an illumination system that provides a beam of radiation, and a support structure that supports a patterning structure. The patterning structure is configured to impart the beam of radiation with a pattern in its cross-section. The apparatus also includes a substrate support that supports a substrate, a projection system that projects the patterned beam onto a target portion of the substrate, and a debris-mitigation system that mitigates debris particles which are formed during use of at least a part of the lithographic apparatus. The debris-mitigation system is arranged to apply a magnetic field so that at least charged debris particles are mitigated.

53 Claims, 8 Drawing Sheets t=t1 t=t2, t2>t1 t=t3, t3>t2 t=t4, t4>t3

LITHOGRAPHIC APPARATUS HAVING A DEBRIS-MITIGATION SYSTEM, A SOURCE FOR PRODUCING EUV RADIATION HAVING A DEBRIS MITIGATION SYSTEM AND A METHOD FOR MITIGATING DEBRIS

BACKGROUND OF THE INVENTION

1. Field of the Invention

The present invention relates to a lithographic apparatus having a debris-mitigation system, a source for producing EUV radiation having a debris mitigation system, and a method for mitigating debris.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

During use of at least a part of the lithographic apparatus, debris particles may be formed within the lithographic apparatus, for example, when radiation sensitive material is removed from the substrate. However, this is not the only process which may give rise to the production of debris particles. For the generation of EUV radiation, usually an object (or gas) is heated by means of high current pinching or by a laser source of high energy density, for example, of at least $10^{11}$ W/cm$^2$, to create a plasma. EUV radiation is produced and undesired particles are released. Also, during production of EUV radiation, which, within the lithographic apparatus is used for providing a projection beam of radiation, debris particles may be produced as a by-product.

The term "debris particles" is meant to encompass particles which are thus formed as a by-product and which need to be mitigated. Debris particles may comprise electrons, ionized particles or neutral particles. The debris particles may have a size in a range varying from the size of an electron towards the size of a micro sized particle. The particles may be part of a plasma and may, within the plasma-environment, comprise fast or slowly moving particles.

These debris particles may have a detrimental effect on the performance of the lithographic apparatus as these debris particles may collect on, for example, optical elements. The debris particles present on these optical elements may hinder the reflection or transmission of the radiation beam. Debris particles with relatively high kinetic energy may even cause serious damage to the apparatus by, for example, etching the optical elements which are, incidentally, very expensive and very crucial parts of the apparatus. Particles present on, or etching surfaces of optical elements may also cause the radiation to be directed in an inaccurate manner, leading to poorly defined features produced on a substrate exposed to the radiation, hence, a need for mitigating debris particles.

The term "mitigating" is meant to encompass any manipulation of the debris particles which may lead to, at least, a reduction of the detrimental effect on the performance of the lithographic apparatus, a reduction of the damage to the lithographic apparatus, or both.

The invention is in particular related to a lithographic apparatus comprising: an illumination system for providing a projection beam of radiation; a support structure for supporting a patterning device, the patterning device serving to impart the projection beam with a pattern in its cross-section; a substrate table for holding a substrate; a projection system for projecting the patterned beam onto a target portion of the substrate; and a debris-mitigation system for mitigating debris particles which are formed during use of at least a part of the lithographic apparatus.

Such a lithographic apparatus is described in WO 99/42904. The debris-mitigation system known from this prior art comprises a filter, in particular a so-called foil trap, which may comprise a plurality of foils or plates which capture the debris particles. The plates or foils are as much as possible oriented parallel to a radiation path so that radiation will pass through the filter.

Although the foil trap is useful, a lithographic apparatus with an additional or alternative debris-mitigation systems is required to, for example, improve the efficiency of the debris-mitigation system, the flexibility in application of a debris-mitigation system and/or allow for more freedom in the design of a lithographic apparatus. It should be understood that charged particles may also be formed from neutrals which are being ionized during mitigation.

SUMMARY OF THE INVENTION

It is, accordingly, an aspect of the present invention to provide a lithographic apparatus with an alternative or improved debris-mitigation system compared to a debris-mitigation system known from the prior art.

According to an aspect of the invention, there is provided a lithographic apparatus comprising: an illumination system for providing a projection beam of radiation; a support structure for supporting a patterning structure, the patterning structure serving to impart the projection beam with a pattern in its cross-section; a substrate table for holding a substrate; a projection system for projecting the patterned beam onto a target portion of the substrate; and a debris-mitigation system for mitigating debris particles which are formed during use of at least a part of the lithographic apparatus, characterized in that the debris-mitigation system is arranged to apply a magnetic field so that at least charged debris particles are mitigated.

In an embodiment of the invention, a lithographic apparatus is provided. The apparatus includes an illumination system that provides a beam of radiation and a support structure that supports a patterning structure. The patterning structure is configured to impart the beam of radiation with a pattern in its cross-section. The apparatus also includes a substrate support that supports a substrate, a projection system that projects the patterned beam onto a target portion of the substrate, and a debris-mitigation system that mitigates debris particles which are formed during use of at least a part of the lithographic apparatus. The debris-mitigation system is arranged to apply a magnetic field so that at least charged debris particles are mitigated.

In another embodiment of the invention, a lithographic apparatus is provided. The apparatus includes an EUV radiation generator that produces EUV radiation. Charged particle debris is generated as a byproduct of EUV radiation production. The apparatus also includes a support structure that supports a patterning structure to be impinged by a beam of the EUV radiation. The patterning structure is configured to impart the beam of radiation with a pattern in its cross-section. The apparatus further includes a substrate support that supports a substrate, a projection system that projects the patterned beam onto a target portion of the substrate, and a magnetic field generator that interacts with the charged debris particles.

The movement of charged debris particles is effected by the presence of a magnetic field. As the charged debris particles interact, for example, by collisions with neutral debris particles, it is possible to also mitigate neutral debris particles by mitigating charged debris particles. The application of a magnetic field can easily be arranged in a debris mitigating system, for example, by positioning permanent magnets onto the walls of a chamber in which debris particles are produced and need to be mitigated, or the application of a coil through which an electric current can flow to introduce a magnetic field. This has the advantage that it will be possible to mitigate at least some of the debris particles without installment of an object such as a filter, or the use of other tangible means for mitigating debris particles within a radiation path or an optical path within the lithographic apparatus.

In an embodiment, the debris mitigating system further comprises a number of debris trapping surfaces. Mitigating may in this embodiment not only refer to directing the debris particles but also to catching the debris particles. As the number of freely moving debris particles will be reduced, the detrimental effect and/or damage caused by the debris particles will be reduced.

In an embodiment, the debris mitigation system is further arranged to apply a magnetic field such that, in use, the charged particles are moved substantially towards at least one of the number of debris trapping surfaces. In this embodiment the magnetic field and the number of debris trapping surfaces are oriented with respect to each other such that the charged particles mitigated by the magnetic field will be caught by at least one of the number of debris trapping surfaces. Hence, the mitigation extends to reduction of the number of—at least—charged debris particles. As stated before, mitigation of charged debris particles, in the sense of directing charged debris particles, may also lead to redirecting neutral debris particles.

In an embodiment, the debris-mitigation system comprises at least one solenoid for applying the magnetic field. This has the advantage that the strength and, the direction of the magnetic field can be varied if so desired. Also, the length of period in which a magnetic field is applied, is controllable when using a solenoid or coil.

In an embodiment of a lithographic apparatus according to the invention, the debris mitigation system is further arranged to apply a magnetic field such that, in use, at least some of the charged debris particles spiralize. Where the charged particles spiralize, the linear velocity of these charged debris particles drop with respect to the linear velocity of the charged debris particle before spiralization. A surface may be damaged by the charged debris particles when the debris particles hit the surface with a velocity above a threshold velocity. It is in those circumstances advantageous to reduce the linear velocity of the charged debris particles down to a linear velocity below the threshold velocity, by spiralization of the charged debris particles.

In practice, the following mechanism may occur. Electrons in a plasma usually have a higher velocity due to a much lesser weight in comparison to the ions in a plasma, and consequently electrons hit a surface well before ions hit that very same surface. However, as the electrons collect at a surface, the ionized particles are accelerated towards that negatively charged surface, hitting the surface with an even higher velocity than would be the case had the surface not been charged with electrons. Hence, it is very advantageous to lower the linear velocity of electrons by bringing electrons in a spiraling movement in order to reduce the number of electrons collecting at a surface, as this result would, on its turn, also reduce the acceleration of positive ions approaching that surface. This embodiment of a debris mitigation system according to the invention is especially useful when the surface is part of an expensive optical element, such as a mirror which loses its efficiency when damaged by impact of particles.

In an embodiment of a lithographic apparatus according to the invention, the debris mitigation system is further arranged to switch the magnetic field alternatingly on and off. This has advantages in a situation where, despite the mitigating effects of the magnetic field on the debris particles, during application of the magnetic field positively and negatively charged debris particles and/or neutral debris particles still manage to collect on a surface which should preferably remain free from collection of debris particles. Once the magnetic field is switched off, the electrons present in the plasma may collect on the surface, attracting the positive ions of the plasma to accelerate to the surface. The impact of positive ions may result in the etching away of the debris particles which still managed to collect on the surface during the period in which the magnetic field had been applied.

In an embodiment of a lithographic apparatus according to the invention, the debris mitigation system is further arranged to apply a gradient to the magnetic field. As the plasma is diamagnetic, it will move into a direction along which the magnetic field decreases. Hence, the debris particles as present in a plasma can be mitigated using a gradient of the magnetic field. The gradient of the magnetic field may, for example, be applied such that the plasma containing debris particles move away from a mirror.

In an embodiment, the debris mitigation system is further arranged to apply the magnetic field dynamically with a predetermined frequency. This pulsing of the magnetic field causes, during each pulse, a very high gradient of the magnetic field. The plasma, being diamagnetic, moves down the gradient of the magnetic field. The pulsed magnetic field provides a "skin" which surrounds a volume in which the plasma particles are contained. Charged particles, and the neutrals which are being ionized, are suppressed and contained within the plasma.

In an embodiment, the debris-mitigation system comprises at least two solenoids which are coaxially aligned, wherein a first one of the at least two solenoids has a diameter which differs from the diameter of a second one of the at least two solenoids. This results in a "magnetic bottle" containing the plasma substantially within a certain volume to reduce the damaging effect of the particles. This will be explained in more detail further on in this specification.

In an embodiment, the debris mitigation system is further arranged to induce, in use, within a group of the debris particles a current such that at least charged debris particles of that group deflect under influence of a force which has a direction perpendicular to a component of the magnetic field and perpendicular to a component of the electric current induced. This provides for an effective way of redirecting at least charged debris particles.

According to a further aspect of the invention, there is provided a debris-mitigation system arranged to be used in a lithographic apparatus as described above.

In an embodiment, a debris-mitigation system for mitigating debris particles within a lithographic apparatus is provided. The debris-mitigation system is arranged to apply a magnetic field so that at least charged debris particles are mitigated.

According to a further aspect of the invention, there is provided a source for producing EUV radiation, having a debris-mitigation system for mitigating debris particles which are formed during production of EUV radiation, wherein the debris-mitigation system is arranged to apply a magnetic field so that at least charged debris particles are mitigated. It should be understood that charged particles may also be formed during mitigation from neutral particles which are being ionized.

In an embodiment, a source for producing EUV radiation is provided. The source includes a debris-mitigation system that mitigates debris particles which are formed during production of EUV radiation. The debris-mitigation system is arranged to apply a magnetic field so that at least charged debris particles are mitigated.

According to a further aspect of the invention, there is provided a method for mitigating debris particles as produced in at least a part of a lithographic apparatus, wherein the method comprises applying a magnetic field so that at least charged debris particles are mitigated. It should be understood that charged particles may also be formed during mitigation from neutral particles which are being ionized.

In an embodiment, a method for mitigating debris as produced during use of at least a part of a lithographic apparatus is provided. The method includes applying a magnetic field so that at least charged debris particles are mitigated.

In a further embodiment, a lithographic method is provided. The method includes generating a beam of EUV radiation, wherein production of the EUV radiation causes generation of charged particle debris as a byproduct, patterning the beam of EUV radiation, projecting the patterned beam of EUV radiation onto a substrate, and generating a magnetic field to interact with the charged debris particles.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" or "patterning structure" as used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of the patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
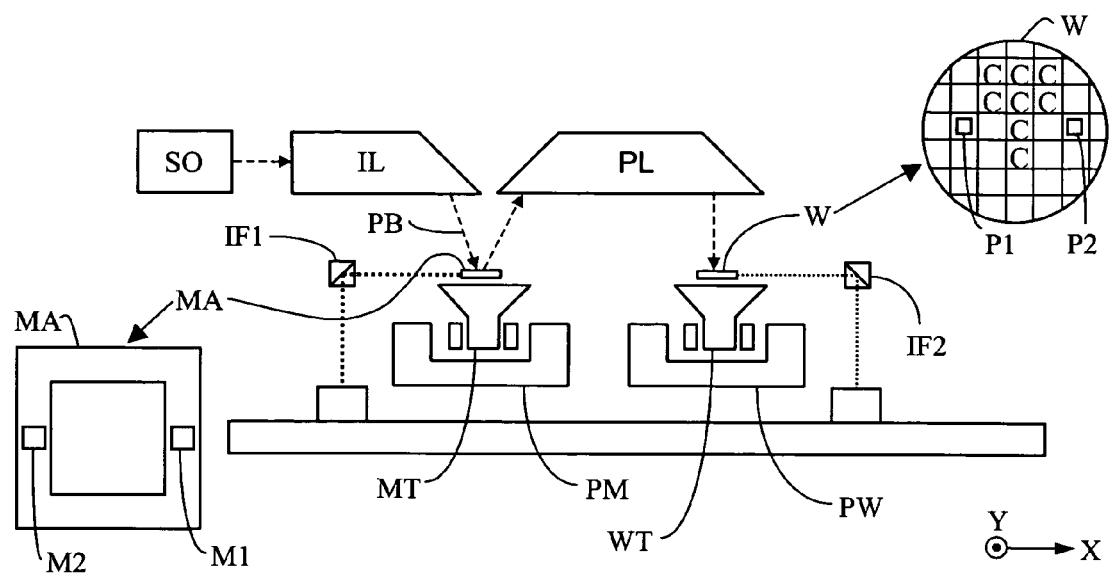
FIG. 1 depicts a lithographic apparatus according to an embodiment of the invention.

FIG. 1 schematically depicts a lithographic apparatus according to a particular embodiment of the invention. The apparatus comprises: an illumination system (illuminator) IL for providing a projection beam PB of radiation (e.g. UV or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. comprising one or more dies) of the substrate W. The term "substrate table" as used herein can also be considered or termed as a substrate support. It should be understood that the term substrate support or substrate table broadly refers to a structure that supports, holds, or carries a substrate.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector comprising, for example, suitable collecting mirrors and/or a spectral purity filter. In other cases, the source may be integral part of the apparatus, for example, when the source is a mercury lamp. The source SO and the illuminator IL, may be referred to as a radiation system.

The illuminator IL may comprise an adjuster for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed. Basically anywhere in the apparatus where debris particles need to be mitigated a debris mitigation system may be employed.

Figure 2:
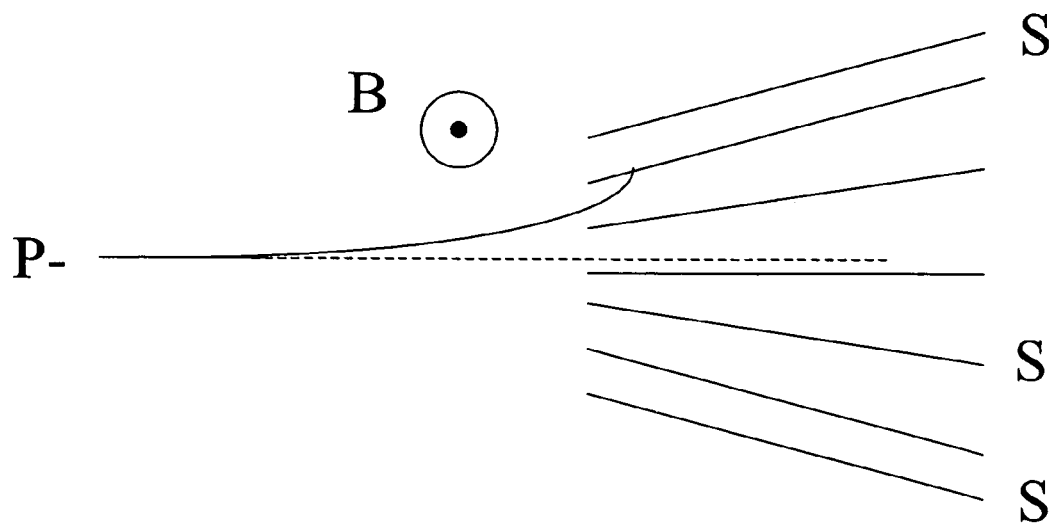
FIG. 2 depicts schematically a first embodiment of a debris mitigation system according to the invention.

FIG. 2 depicts schematically a first embodiment of a debris mitigation system according to the invention. This debris mitigation system is arranged to apply a magnetic field so that at least charged debris particles are mitigated. The magnetic field is indicated by B. The circle with a dot therein indicates that the magnetic field is directed towards the viewer of FIG. 2. A negatively charged particle P−, which might be an electron or a negatively charged ion, freely moving or present within a plasma, will reflect from the direction into which it was moving before entering the magnetic field. Instead of following the dashed line the negative particles is now deflected following the continuous line. In this figure the debris mitigation system further comprises a number of debris trapping surfaces S, which may be part of a foil trap as disclosed in WO99/42904.

The debris mitigation system is arranged to apply the magnetic field such that, in use, the charged particles are moved substantially towards at least one of the number of debris trapping surfaces S. It should be noted that radiation, which is not deflected by the magnetic field, may follow the dashed line and will pass along the debris trapping surfaces. The combination of a foil trap, taken as the set of debris trapping surfaces as shown in FIG. 2, and the application of a magnetic field, improves the filtering effect of the filter, without reducing the radiation which passes the filter. It can easily be calculated that reasonable deflections of ions will be achieved with a magnetic field in the order of about 0.01 to 1T. For a more detailed description of the foil trap shown in FIG. 2 reference is made to WO 99/42904, incorporated herein by reference. Those skilled in the art can easily calculate as to how the distances between the debris trapping surfaces S, the dimensions of the surfaces S and the strength of the magnetic filed B should relate in order to achieve an efficient debris mitigation system according to the invention.

Figure 3:
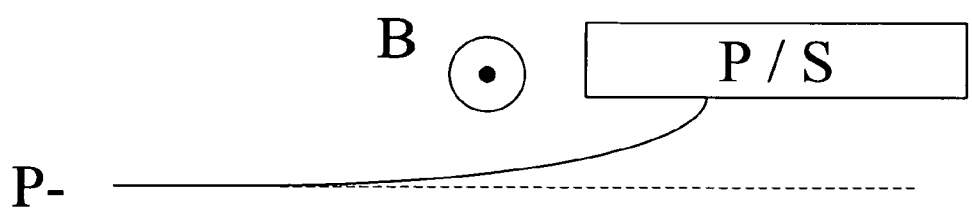
FIG. 3 depicts schematically a second embodiment of a debris mitigation system according to the invention.

FIG. 3 is similar to FIG. 2. However, instead of a number of debris trapping surfaces, one surface, or, for example, a pump is shown as part of the debris mitigation system. The pump P shown in FIG. 3 may, for example, be an ion getter pump. For a person skilled in the art, it will not be a problem to arrange the debris mitigation systems such that a magnetic field as outlined here above, can be applied. Such a field can be generated, for example, by placing magnets at suitable positions or applying a coil and a power supply for generating a magnetic field within the coil.

Figure 4A:
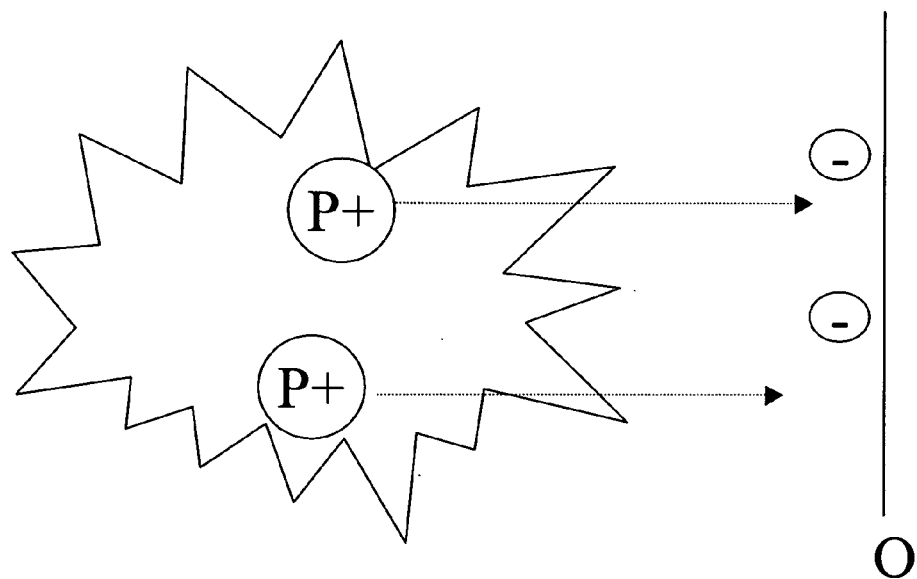
FIG. 4a depicts schematically a plasma containing debris particles close to a mirror surface in a lithographic apparatus according to embodiments of the invention.
Figure 4B:
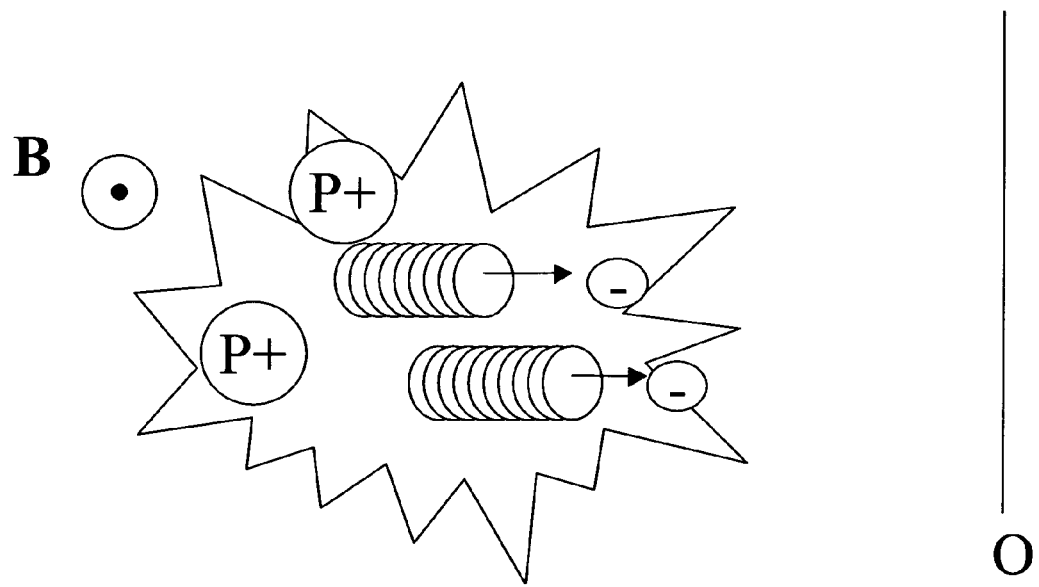
FIG. 4b depicts schematically a third embodiment of a debris mitigation system according to the invention.

In general, charged particles in a plasma may leave the plasma and stick to a surface nearby. The surface may, for example, be a particles trapping surface, and in that case, the debris particles are mitigated. Such a surface may, for example, comprise relief to enhance the likelihood that a particle gets stuck within the surface, or at least slowed down. In other cases, the surface may be part of, for example, an expensive optical element or component such as a mirror or a lens. In that case, interaction of particles from the plasma with the optical element is highly undesired. As electrons are much lighter than positively charged ions, such a surface may first be negatively charged by electrons. This causes positively charged ions to be accelerated towards the surface (FIG. 4a). The impact of these much heavier positively charged ions may damage this surface. An embodiment of a debris mitigation system according to the invention is further arranged to apply the magnetic field such that, in use, at least some of the charged debris particles spiralize. This leads to a decrease of the diffusion coefficient of those particles. As these particles interact with other particles, the mean free path of these particles will be shortened. This may lead to joining a flow due to a pressure difference within the lithographic apparatus or the source for radiation. This difference in pressure may be produced by a pump. As shown in FIG. 4b, this may also lead to suppressing the electrons in approaching a surface of optical component O. For application of this embodiment of a debris mitigation-system according to the invention in a lithographic apparatus or a source used for production of EUV radiation, the magnetic field may be in the order of about 0.01-1T.

Figure 4C:
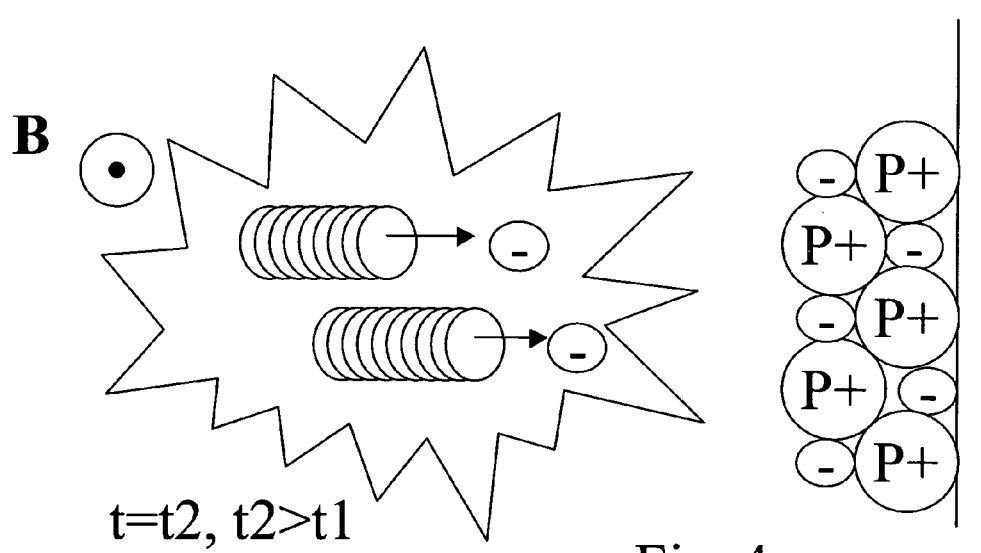
FIG. 4c depicts schematically a fourth embodiment of a debris mitigation system according to the invention.

Even though debris particles are mitigated by the application of a magnetic field such that, in use, at least some of the charged debris particles spiralize, after some time, for example, t=t2 with t2 being later than t1 (see FIGS. 4b and 4c), some particles may still collect at a surface even though the surface is not being damaged or only being damaged marginally by the impact of particles. This situation is shown in FIG. 4c.

Figure 4D:
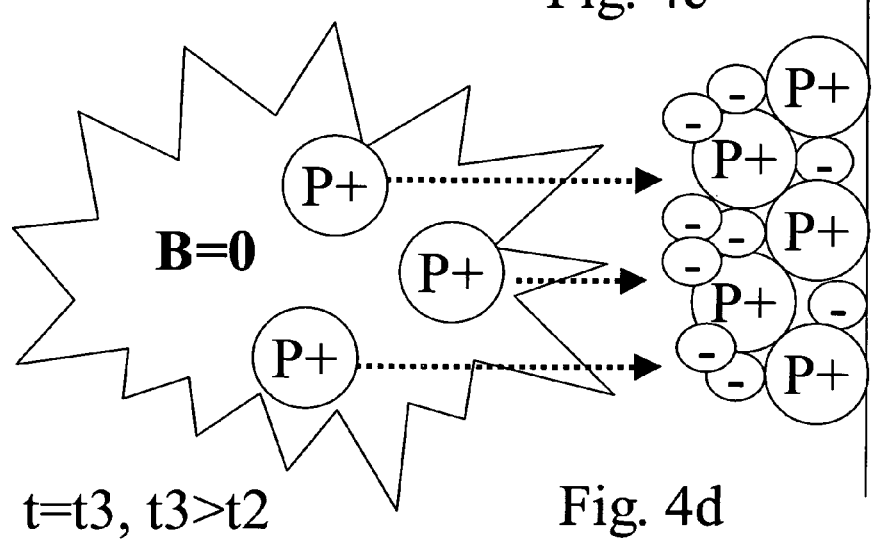
FIG. 4d depicts schematically a debris mitigation system shown in FIG. 4c at a time later than the time shown in FIG. 4c.
Figure 4E:
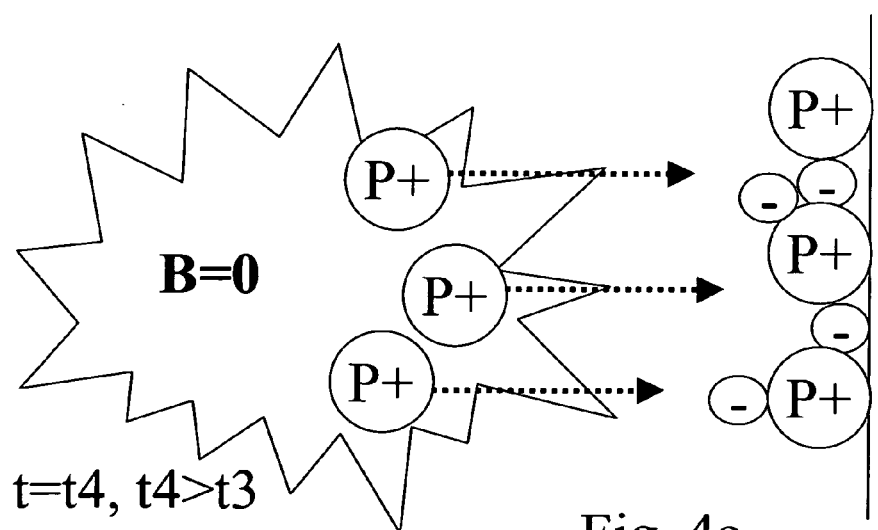
FIG. 4e the debris mitigation system shown in FIG. 4c and in FIG. 4d at a time later than shown in FIG. 4d.

The debris mitigation system may further be arranged to switch the magnetic field alternatingly on and off. The effect of switching of the magnetic field is illustrated in FIG. 4d, which shows a situation at t=t3 being later than t2. Electrons which move faster than positively charged ions will reach the surface and charge the surface negatively. The potential difference between the plasma and the surface triggers the positively charged ions to accelerate towards the surface. This leads eventually to a situation schematically shown in FIG. 4e, which shows the situation or t=t4, with t4 being later than t3. The positively charged ions now impact on the particles sticking to the surface. In this way, the debris particles sticking to the surface of, for example, an optical element are being etched away. Once all the debris particles have been removed from the surface, the magnetic field should be switched on to prevent the surface from being etched itself by the positively charged ions approaching the surface and from again fastly building up a layer of debris. By alternatingly switching the magnetic field on and off, the surface may part of the time be covered by debris particles, which are another part of the time being removed from that surface. Situations occurring in the course of time during alternatingly switching on and off the magnetic field are schematically shown in FIG. 4b, FIG. 4c, FIG. 4d, FIG. 4e and then again in FIG. 4b, FIG. 4c, FIG. 4d, FIG. 4e, etc.

It will be understood that a debris mitigation system which is arranged to switch the magnetic field alternatingly on and off will comprise at least solenoid for easily applying the magnetic field and switching off the magnetic field. With routine experiments, the person skilled in the art will be able to determine which frequency of alternation and which amplitude provide an optimized mitigation process. It should be noted that the switching on and off of the magnetic field may also be applied to clean other contaminants away from the surface O of an optical component.

Figure 5:
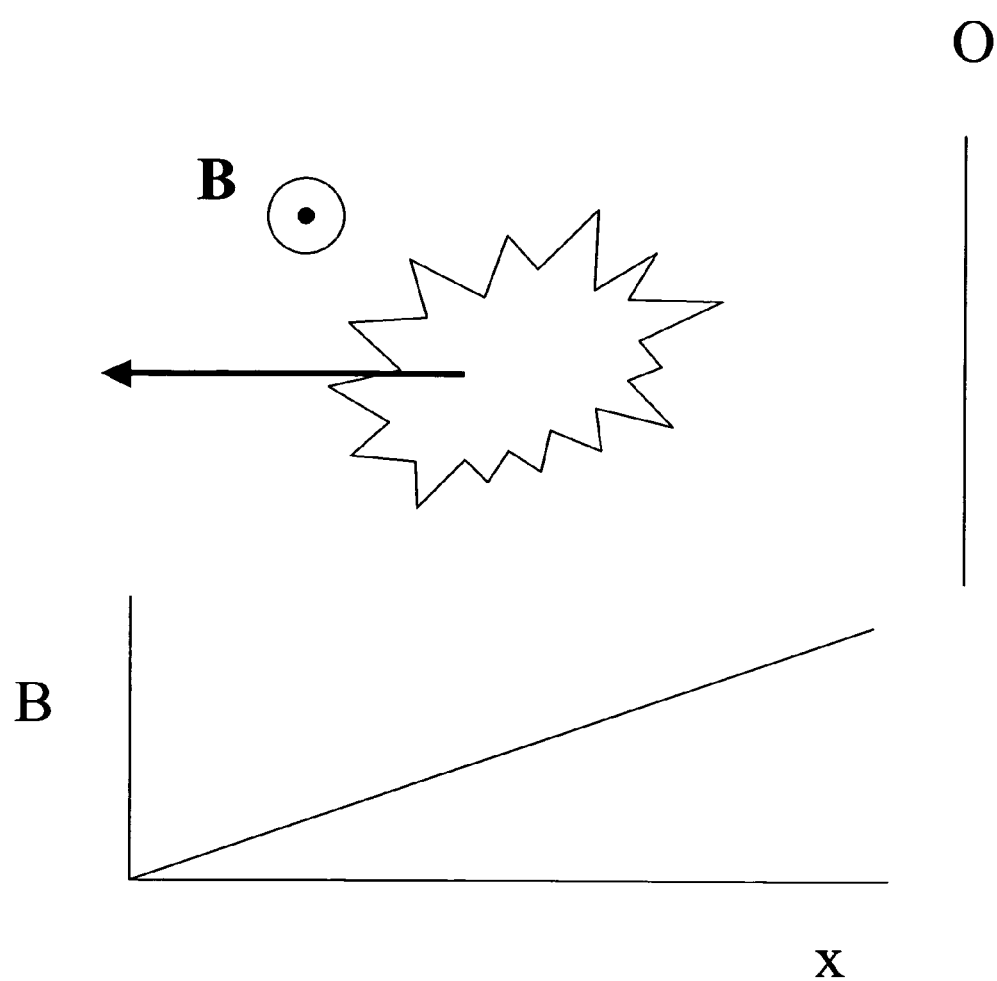
FIG. 5 depicts schematically a fifth embodiment of a debris mitigation system according to the invention.

An embodiment of a debris mitigation system according to the invention is further arranged to apply a gradient to the magnetic field. This is schematically shown in FIG. 5. Due to the diamagnetic properties of a plasma comprising debris particles, the plasma will move into a direction into which the magnetic field drops. This is also regarded as a form of mitigating debris particles. Both pulsed and permanent magnets can be used in order to create a magnetic field with a gradient in the vicinity of, for example, optical elements.

Figure 6:
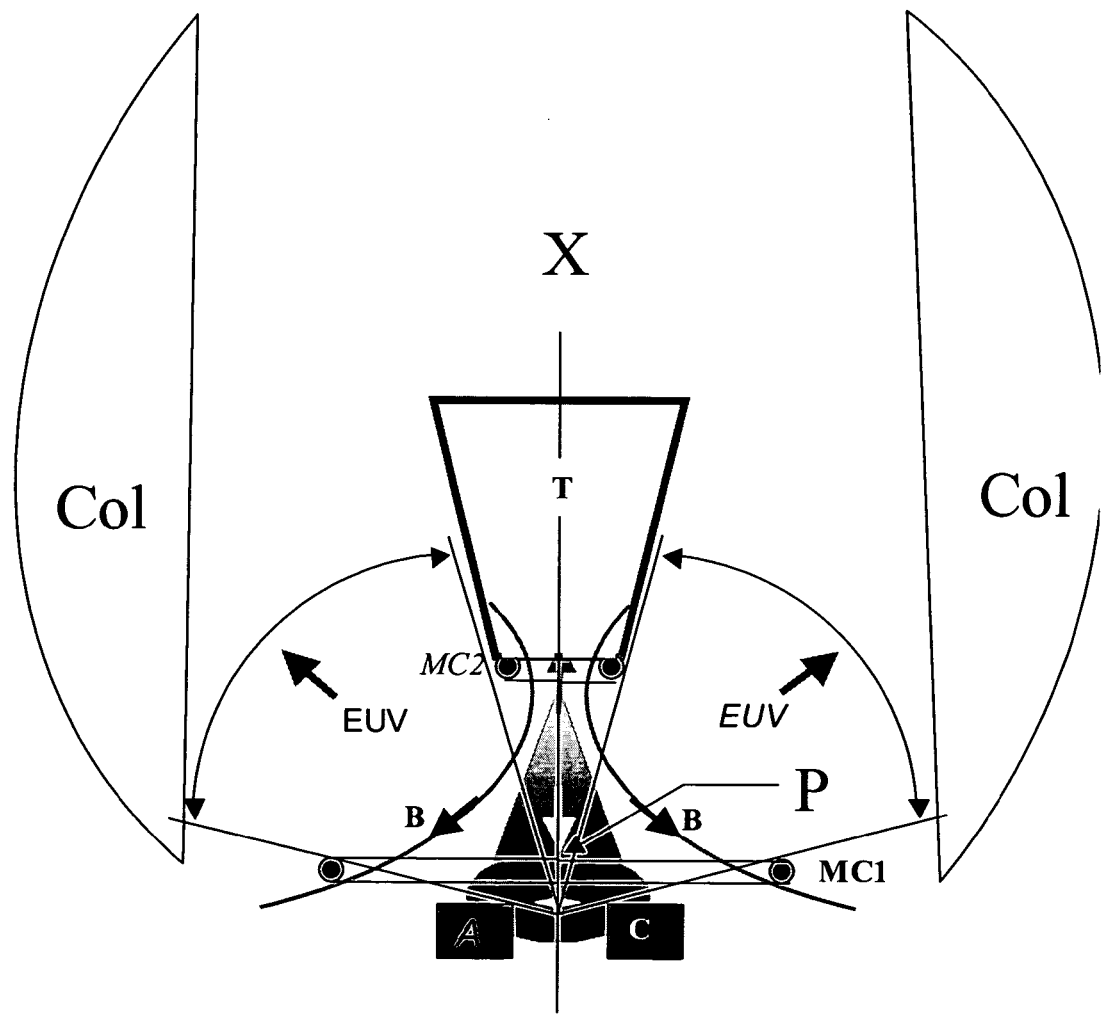
FIG. 6 depicts schematically a sixth embodiment of a debris mitigation system according to the invention.

FIG. 6 shows schematically an embodiment of a debris mitigating system according to the invention as implemented in a source for EUV radiation. FIG. 6 is a cross section of a substantially cylindrical configuration with main axis X. A source for EUV radiation comprises an anode A and a cathode C between which, in use, EUV radiation is produced in a manner well-known in the art. The collector Col is arranged such that EUV radiation can be collected. At least two solenoids are arranged such that a magnetic field is generated in order to prevent a plasma containing debris particles, or debris particles from the plasma, to enter the collector Col. In the embodiment shown in FIG. 6, the debris-mitigation system comprises as two solenoids, magnetic coils MC1, MC2, which are substantially coaxially aligned. The first one of the at least two solenoids (MC1) has a diameter which differs from the diameter of a second one (MC2) of the two solenoids. The diameter of the first solenoid MC1 in this case is larger than the diameter of the second solenoid MC2. It will be clear that the debris-mitigation system is arranged such that an electrical current can flow through the magnetic coils in order to generate a magnetic field as indicated by arrows B. In use, the strength of the magnetic field close to the solenoid MC1 is weaker than the magnetic field close to solenoid MC2. The strongest magnetic field is on the axis within the solenoid MC2. As the plasma containing debris particles, as generated during the production of EUV, is diamagnetic, the plasma containing debris particles tends to move towards the electrodes, rather than spreading out towards the collector Col. This manner of containing a plasma with debris particles within a predetermined volume is referred to as "the magnetic bottle". It should be noted that debris particles may actually escape from the magnetic bottle close to the second solenoid MC2. In the embodiment shown in FIG. 6, solenoid MC2 allows for escape of debris particles through the second solenoid MC2 away from the electrodes. In this escape path of the debris particles, a debris particle trap T, such as the earlier described foil trap, may be placed, as shown, to trap the debris particles. It is possible to apply the magnetic field dynamically with a predetermined frequency. The effect of this, a so-called "skin effect", will be explained below.

Figure 7:
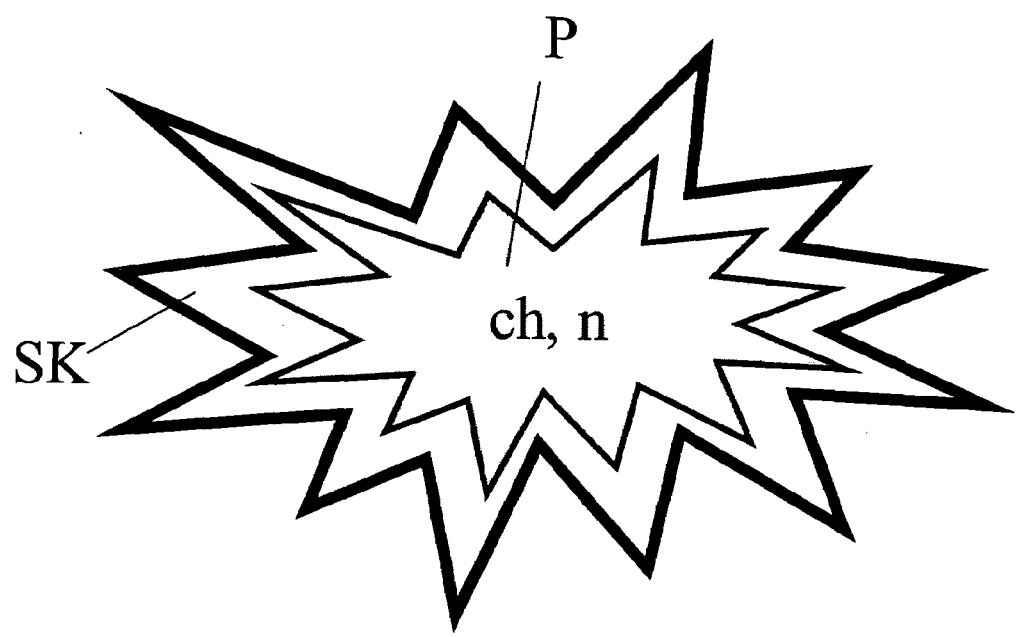
FIG. 7 depicts schematically an embodiment for providing a so-called magnetic skin around a plasma containing debris particles.
Figure 7:
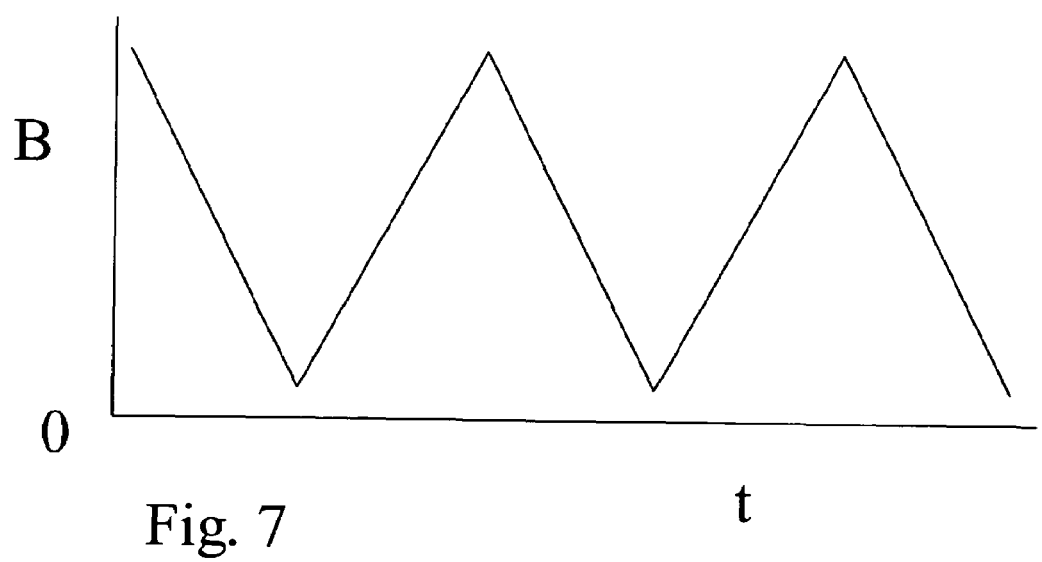

FIG. 7 shows schematically an embodiment for providing a so-called magnetic "skin" SK around a plasma P containing debris particles. In this embodiment, the debris-mitigation system is arranged to apply the magnetic field dynamically with a predetermined frequency. This is conveniently carried out by pulsing an electric current through the relevant coils or solenoids. Each pulse causes a gradient in the magnetic field. This way of producing a gradient of the magnetic field is therefore relatively easy and possible with an electric current which is as large as an electric current used for applying a magnetic field within the relevant coils or solenoids. The plasma, being diamagnetic, moves in a direction down the gradient and as such the plasma containing debris particles is, for example, in addition to the containment in the "magnetic bottle", further suppressed within a volume bordered by the "magnetic skin" SK. The magnetic field B may be of the order of about 0.1 to about 1 T. The "magnetic skin" SK may have a thickness which is about a tenth of the main plasma size. The magnetic field frequency then usually has to be higher than about 0.1 MHz in order to trap fast particles within the plasma. The fast particles comprise charged particles ch and neutral particles n which are being ionized while being mitigated by the magnetic field and/or its gradient. A person skilled in the art will easily be able to fine-tune the relevant parameters to achieve a optimum in the desired mitigating effect. Due to the fact that the charged particles, including electrons, move away from "the skin" of the bottle inwards the plasma, and as such also pass the volume containing neutral gas particles, it is possible that these charged particles ionize the neutrals inside the plasma. These newly ionized particles (former neutrals) are also being trapped in this plasma containment field, i.e. the magnetic bottle.

It should be noted that this embodiment can easily be combined with the embodiment as shown in FIG. 6.

Figure 8:
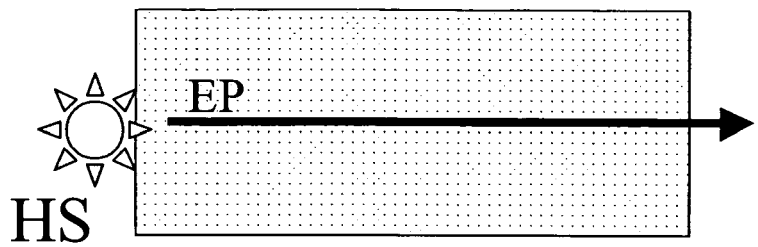
FIGS. 8 a, b and c depict schematically a seventh embodiment of a debris mitigation system according to the invention.
Figure 8:
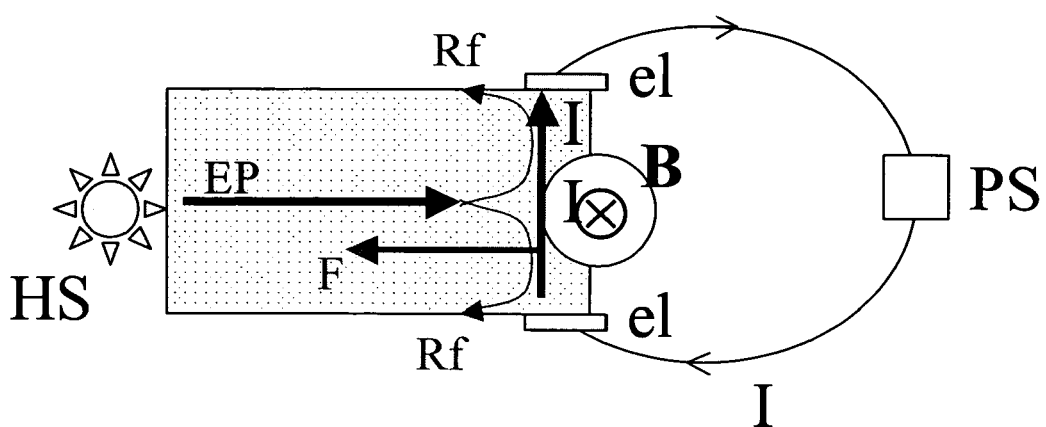
Figure 8:
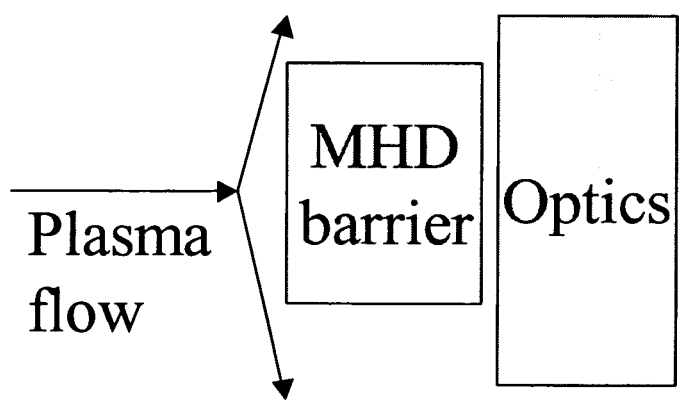

In FIG. 8a-8c, an embodiment is shown wherein a debris mitigation system is further arranged to induce, in use, within a group of the debris particles, an electric current such that at least charged debris particles of that group deflect under influence of a force which has a direction perpendicular to a component of the electric current induced. This embodiment may be further described as follows. A hot spot HS (see FIG. 8a) might have been formed due to, for example, production of EUV. From the hot spot HS, a plasma EP expands as a gas in a vacuum with velocities possibly up to about 105 m/s. In this embodiment, magnetic field B is applied, as shown in FIG. 8b. The embodiment is arranged to induce, within the expanding plasma EP, an external current I by means of a power supply PS and electrodes el. Due to the electric current induced in the expanding plasma and the magnetic field B, the charged particles within the plasma, i.e. a group of debris particles, are forced by force F to move back towards the hot spot HS, or opposite the direction of the expanding plasma EP, causing a reflected flow Rf of debris particles.

It should be understood that the electric current referred to above is a current which has been induced by means of a voltage difference, in this example, applied across the expanding plasma EP. For this purpose, an external circuit may be used. This external circuit may comprise electrodes el, electric wires and a power supply PS. However the external circuit may also comprise metal walls surrounding the volume which contains the expanding plasma EP. The force F forcing particles to move in the direction of force F may be referred to as a Magneto Hydro Dynamical barrier MHD. Such a MHD barrier may be employed in other situations where a plasma flow needs to be stopped or deflected. It is possible to direct debris particles contained in a plasma flow towards a trap, or other debris trapping surfaces. It is possible to apply the embodiment shown in FIG. 8a-8c such that optical components are protected from a plasma flow by means of a MHD barrier as schematically shown in FIG. 8c. The magnetic field applied in this embodiment may be in the range of about 0.01-1T. The induced current needed to cause the effect as described will easily be found by routine experiments by a person skilled in the art.

While specific embodiments of the invention have been described above, it will be appreciated that the invention may be practiced otherwise than as described. This description is not intended to limit the invention.

What is claimed is:

1. A lithographic apparatus comprising:
   an illumination system that provides a beam of radiation;
   a support structure that supports a patterning structure, the patterning structure configured to impart the beam of radiation with a pattern in its cross-section;
   a substrate support that supports a substrate;
   a projection system that projects the patterned beam onto a target portion of the substrate; and
   a debris-mitigation system that mitigates debris particles which are formed during use of at least a part of the lithographic apparatus, wherein the debris-mitigation system is arranged to apply a magnetic field so that at least charged debris particles are mitigated, wherein the debris-mitigation system is further arranged to switch the magnetic field alternatingly on and off, and wherein the debris mitigation system is further arranged to induce, in use, within a group of the debris particles, a current such that at least charged debris particles of that group deflect under influence of a force which has a direction perpendicular to a component of the magnetic field and perpendicular to a component of the electric current induced.

2. A lithographic apparatus according to claim 1, wherein the debris-mitigation system comprises a plurality of debris-trapping surfaces.

3. A lithographic apparatus according to claim 2, wherein the debris-mitigation system is further arranged to apply the magnetic field such that, in use, the charged particles are moved substantially towards at least one of the plurality of debris-trapping surfaces.

4. A lithographic apparatus according to claim 1, wherein the debris-mitigation system is further arranged to apply the magnetic field such that, in use, at least some of the charged debris particles spiralize.

5. A lithographic apparatus according to claim 1, wherein the debris-mitigation system comprises at least one solenoid for applying the magnetic field.

6. A lithographic apparatus according to claim 1, wherein the debris-mitigation system comprises at least two solenoids which are substantially coaxially aligned, wherein a first one of the at least two solenoids has a diameter which differs from the diameter of a second one of the at least two solenoids.

7. A debris-mitigation system for mitigating debris particles within a lithographic apparatus, wherein the debris-mitigation system is arranged to apply a magnetic field so that at least charged debris particles are mitigated, and wherein the debris-mitigation system is further arranged to apply a gradient to the magnetic field to create a volume in which the chained debris particles are substantially contained.

8. A debris-mitigation system according to claim 7, wherein the debris-mitigation system further comprises a plurality of debris-trapping surfaces.

9. A debris-mitigation system according to claim 8, wherein the debris-mitigation system is further arranged to apply the magnetic field such that, in use, the charged particles are moved substantially towards at least one of the plurality of debris-trapping surfaces.

10. A debris-mitigation system according to claim 7, wherein the debris-mitigation system comprises at least one solenoid for applying the magnetic field.

11. A debris-mitigation system according to claim 7, wherein the debris-mitigation system is further arranged to apply the magnetic field dynamically with a predetermined frequency to create the gradient.

12. A debris-mitigation system according to claim 7, wherein the debris-mitigation system comprises at least two solenoids which are substantially coaxially aligned, wherein a first one of the at least two solenoids has a diameter which differs from the diameter of a second one of the at least two solenoids.

13. A debris-mitigation system according to claim 7, wherein the debris mitigation system is further arranged to induce, in use, within a group of the debris particles an electric current such that at least charged debris particles of that group deflect under influence of a force which has a direction perpendicular to a component of the magnetic field and perpendicular to a component of the electric current induced.

14. A debris-mitigation system according to claim 7, wherein the debris-mitigation system is further arranged to allow at least some of the charged debris particles to escape from the volume.

15. A source for producing EUV radiation, comprising a debris-mitigation system that mitigates debris particles which are formed during production of EUV radiation, wherein the debris-mitigation system is arranged to apply a magnetic field so that at least charged debris particles are mitigated, and wherein the debris mitigation system is further arranged to induce, in use, within a group of the debris particles an electric current such that at least charged debris particles of that group deflect under influence of a force which has a direction perpendicular to a component of the magnetic field and perpendicular to a component of the electric current induced.

16. A source according to claim 15, wherein the debris-mitigation system further comprises a plurality of debris-trapping surfaces.

17. A source according to claim 16, wherein the debris-mitigation system is further arranged to apply the magnetic field such that, in use, the charged particles are moved substantially towards at least one of the plurality of debris-trapping surfaces.

18. A source according to claim 15, wherein the debris-mitigation system comprises at least one solenoid for applying the magnetic field.

19. A source according to claim 15, wherein the debris-mitigation system is further arranged to switch the magnetic field alternatingly on and off.

20. A source according to claim 15, wherein the debris-mitigation system is further arranged to apply a gradient to the magnetic field.

21. A source according to claim 15, wherein the debris-mitigation system is further arranged to apply the magnetic field dynamically with a predetermined frequency.

22. A source for producing EUV radiation according to claim 15, wherein the debris-mitigation system comprises at least two solenoids which are substantially coaxially aligned, wherein a first one of the at least two solenoids has a diameter which differs from the diameter of a second one of the at least two solenoids.

23. A method for mitigating debris as produced during use of at least a part of a lithographic apparatus, the method comprising:
    applying a magnetic field so that at least charged debris particles are mitigated; and
    applying a gradient to the magnetic field to create a volume in which the charged debris particles are substantially contained.

24. A method according to claim 23, wherein the debris-mitigation system further comprises a plurality of debris-trapping surfaces.

25. A method according to claim 24, wherein the magnetic field is applied such that, in use, the charged particles are moved substantially towards at least one of the number of debris-trapping surfaces.

26. A method according to claim 23, wherein the debris-mitigation system comprises at least one solenoid for applying the magnetic field.

27. A method according to claim 23, wherein the magnetic field is alternatingly switched on and off.

28. A method according to claim 23, wherein the magnetic field is applied dynamically with a predetermined frequency to create the gradient.

29. A method according to claim 23, wherein the debris-mitigation system comprises at least two solenoids which are substantially coaxially aligned, wherein a first one of the at least two solenoids has a diameter which differs from the diameter of a second one of the at least two solenoids.

30. A method according to claim 23, wherein within a group of the desired particles an external electric current is induced such that at least charged debris particles deflect under influence of a force which has a direction perpendicular to a component of the magnetic field and perpendicular to a component of the electric current externally induced.

31. A method according to claim 23, wherein the magnetic field is applied such that at least some of the charged debris particles escape from the volume.

32. A lithographic method comprising:
generating a beam of EUV radiation, wherein production of said EUV radiation causes generation of charged particle debris as a byproduct;
patterning said beam of EUV radiation;
projecting said patterned beam of EUV radiation onto a substrate;
generating a magnetic field to interact with said charged debris particles; and
applying a gradient to the magnetic field to create a volume in which the charged debris particles are substantially contained.

33. A lithographic method according to claim 32, wherein the magnetic field is applied such that at least some of the charged debris particles escape from the volume.

34. A lithographic apparatus comprising:
an illumination system that provides a beam of radiation;
a support structure that supports a patterning structure, the patterning structure configured to impart the beam of radiation with a pattern in its cross-section;
a substrate support that supports a substrate;
a projection system that projects the patterned beam onto a target portion of the substrate; and
a debris-mitigation system that mitigates debris particles which are formed during use of at least a part of the lithographic apparatus, wherein the debris-mitigation system is arranged to apply a magnetic field so that at least charged debris particles are mitigated, and wherein the debris-mitigation system is further arranged to apply a gradient to the magnetic field to create a volume in which the charged debris particles are substantially contained.

35. A lithographic apparatus according to claim 34, wherein the debris-mitigation system comprises a plurality of debris-trapping surfaces.

36. A lithographic apparatus according to claim 35, wherein the debris-mitigation system is further arranged to apply the magnetic field such that, in use, the charged particles are moved substantially towards at least one of the plurality of debris-trapping surfaces.

37. A lithographic apparatus according to claim 34, wherein the debris-mitigation system is further arranged to apply the magnetic field such that, in use, at least some of the charged debris particles spiralize.

38. A lithographic apparatus according to claim 34, wherein the debris-mitigation system comprises at least one solenoid for applying the magnetic field.

39. A lithographic apparatus according to claim 34, wherein the debris-mitigation system comprises at least two solenoids which are substantially coaxially aligned, wherein a first one of the at least two solenoids has a diameter which differs from the diameter of a second one of the at least two solenoids.

40. A lithographic apparatus according to claim 34, wherein the debris-mitigation system is further arranged to allow at least some of the charged debris particles to escape from the volume.

41. A lithographic apparatus comprising:
an illumination system that provides a beam of radiation;
a support structure that supports a patterning structure, the patterning structure configured to impart the beam of radiation with a pattern in its cross-section;
a substrate support that supports a substrate;
a projection system that projects the patterned beam onto a target portion of the substrate; and
a debris-mitigation system that mitigates debris particles which are formed during use of at least a part of the lithographic apparatus, wherein the debris-mitigation system is arranged to apply a magnetic field so that at least charged debris particles are mitigated, and wherein the debris-mitigation system is further arranged to apply the magnetic field dynamically with a predetermined frequency to create a volume in which the charged debris particles are substantially contained.

42. A lithographic apparatus according to claim 41, wherein the debris-mitigation system comprises a plurality of debris-trapping surfaces.

43. A lithographic apparatus according to claim 42, wherein the debris-mitigation system is further arranged to apply the magnetic field such that, in use, the charged particles are moved substantially towards at least one of the plurality of debris-trapping surfaces.

44. A lithographic apparatus according to claim 41, wherein the debris-mitigation system is further arranged to apply the magnetic field such that, in use, at least some of the charged debris particles spiralize.

45. A lithographic apparatus according to claim 41, wherein the debris-mitigation system comprises at least one solenoid for applying the magnetic field.

46. A lithographic apparatus according to claim 41, wherein the debris-mitigation system comprises at least two solenoids which are substantially coaxially aligned, wherein a first one of the at least two solenoids has a diameter which differs from the diameter of a second one of the at least two solenoids.

47. A lithographic apparatus according to claim 41, wherein the debris-mitigation system is further arranged to allow at least some of the charged debris particles to escape from the volume.

48. A lithographic apparatus comprising:
an illumination system that provides a beam of radiation;
a support structure that supports a patterning structure, the patterning structure configured to impart the beam of radiation with a pattern in its cross-section;
a substrate support that supports a substrate;
a projection system that projects the patterned beam onto a target portion of the substrate; and
a debris-mitigation system that mitigates debris particles which are formed during use of at least a part of the lithographic apparatus, wherein the debris-mitigation system is arranged to apply a magnetic field so that at least charged debris particles are mitigated, wherein the debris mitigation system is further arranged to induce, in use, within a group of the debris particles an electric current such that at least charged debris particles of that group deflect under influence of a force which has a direction perpendicular to a component of the magnetic field and perpendicular to a component of the electric current induced.

49. A lithographic apparatus according to claim 48, wherein the debris-mitigation system comprises a plurality of debris-trapping surfaces.

50. A lithographic apparatus according to claim 49, wherein the debris-mitigation system is further arranged to apply the magnetic field such that, in use, the charged particles are moved substantially towards at least one of the plurality of debris-trapping surfaces.

51. A lithographic apparatus according to claim 48, wherein the debris-mitigation system is further arranged to apply the magnetic field such that, in use, at least some of the charged debris particles spiralize.

52. A lithographic apparatus according to claim 48, wherein the debris-mitigation system comprises at least one solenoid for applying the magnetic field.

53. A lithographic apparatus according to claim 48, wherein the debris-mitigation system comprises at least two solenoids which are substantially coaxially aligned, wherein a first one of the at least two solenoids has a diameter which differs from the diameter of a second one of the at least two solenoids.

* * * * *